(12) United States Patent
Hayashi et al.

(10) Patent No.: US 11,600,602 B2
(45) Date of Patent: Mar. 7, 2023

(54) SEMICONDUCTOR POWER MODULE

(71) Applicant: ROHM CO., LTD., Kyoto (JP)

(72) Inventors: Kenji Hayashi, Kyoto (JP); Masashi Hayashiguchi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 128 days.

(21) Appl. No.: 17/173,935

(22) Filed: Feb. 11, 2021

(65) Prior Publication Data

US 2021/0175213 A1    Jun. 10, 2021

Related U.S. Application Data

(63) Continuation of application No. 16/793,753, filed on Feb. 18, 2020, now Pat. No. 10,950,582, which is a
(Continued)

(30) Foreign Application Priority Data

Jun. 1, 2016 (JP) ................................. 2016-110383

(51) Int. Cl.
*H01L 25/07* (2006.01)
*H01L 23/36* (2006.01)
(Continued)

(52) U.S. Cl.
CPC .............. *H01L 25/07* (2013.01); *H01L 23/36* (2013.01); *H01L 23/488* (2013.01); *H01L 24/06* (2013.01);
(Continued)

(58) Field of Classification Search
None
See application file for complete search history.

(56) References Cited

U.S. PATENT DOCUMENTS

| 5,471,089 A | 11/1995 | Nagatomo et al. |
| 7,791,208 B2 | 9/2010 | Bayerer |

(Continued)

FOREIGN PATENT DOCUMENTS

| JP | H0621323 | 1/1994 |
| JP | H09102578 | 4/1997 |

(Continued)

OTHER PUBLICATIONS

International Search Report issued for International Patent Application No. PCT/JP2017/020303, dated Aug. 15, 2017, 5 pages including English translation.
(Continued)

*Primary Examiner* — J. E. Schoenholtz
(74) *Attorney, Agent, or Firm* — Hamre, Schumann, Mueller & Larson, P.C.

(57) ABSTRACT

A semiconductor power module including an insulating substrate having one surface and another surface, an output side terminal arranged at a one surface side of the insulating substrate, a first power supply terminal arranged at the one surface side of the insulating substrate, a second power supply terminal to which a voltage of a magnitude different from a voltage applied to the first power supply terminal is to be applied, and arranged at another surface side of the insulating substrate so as to face the first power supply terminal across the insulating substrate, a first switching device arranged at the one surface side of the insulating substrate and electrically connected to the output side terminal and the first power supply terminal, and a second switching device arranged at the one surface side of the insulating substrate and electrically connected to the output side terminal and the second power supply terminal.

17 Claims, 10 Drawing Sheets

Related U.S. Application Data continuation of application No. 16/301,544, filed as application No. PCT/JP2017/020303 on May 31, 2017, now Pat. No. 10,600,764.

(51) Int. Cl.
*H01L 23/488* (2006.01)
*H01L 23/00* (2006.01)
*H01L 25/18* (2006.01)
*H02M 7/48* (2007.01)

(52) U.S. Cl.
CPC .............. *H01L 24/49* (2013.01); *H01L 25/18* (2013.01); *H02M 7/48* (2013.01); *H01L 2224/0603* (2013.01); *H01L 2224/4903* (2013.01); *H01L 2224/49175* (2013.01); *H01L 2224/49431* (2013.01); *H01L 2224/49433* (2013.01); *H01L 2924/13055* (2013.01)

(56) References Cited

U.S. PATENT DOCUMENTS

| | | | |
|---|---|---|---|
| 8,487,407 B2 | 7/2013 | Bayerer et al. | |
| 8,648,643 B2 | 2/2014 | Wu | |
| 9,077,335 B2 * | 7/2015 | Hughes | ............... H01L 23/5385 |
| 10,304,770 B2 | 5/2019 | Liu et al. | |
| 10,600,764 B2 * | 3/2020 | Hayashi | .................. H01L 23/36 |
| 10,950,582 B2 * | 3/2021 | Hayashi | ................ H01L 23/488 |
| 2009/0085219 A1 * | 4/2009 | Bayerer | ............... H05K 7/1432 |
| | | | 257/E23.079 |
| 2013/0075932 A1 | 3/2013 | Schwarzer et al. | |
| 2015/0131232 A1 | 5/2015 | Ishino et al. | |
| 2015/0223316 A1 | 8/2015 | Fujino et al. | |

FOREIGN PATENT DOCUMENTS

| | | |
|---|---|---|
| JP | 2011176087 | 9/2011 |
| JP | 2013125848 | 6/2013 |
| JP | 2013222885 | 10/2013 |
| JP | 2014011338 | 1/2014 |
| WO | 2014034411 | 3/2014 |

OTHER PUBLICATIONS

International Preliminary Report on Patentability issued for International Patent Application No. PCT/JP2017/020303, dated Dec. 13, 2018, 24 pages including English translation.

Definition of substratum downloaded from URL<https://www.merriam-webster.com/dictionary/substratum> on Jul. 26, 2019 (Year: 2019), 1 page.

* cited by examiner

SEMICONDUCTOR POWER MODULE

TECHNICAL FIELD

The present invention relates to a semiconductor power module.

BACKGROUND ART

An inverter module is disclosed as an example of a semiconductor power module including switching devices in Patent Document 1. This inverter module includes a first semiconductor device (first switching device), a second semiconductor device (second switching device), and a resin case housing the semiconductor devices.

A positive terminal (power supply terminal) connected to the first semiconductor device and a negative terminal (power supply terminal) connected to the second semiconductor device are arranged across an interval at one end portion of the resin case, in this inverter module. A pair of output side terminals connected in common to the first semiconductor device and the second semiconductor device is arranged at another end portion of the resin case.

CITATION LIST

Patent Literature

Patent Literature 1: Japanese Patent Application Publication No. 2013-222885

SUMMARY OF INVENTION

Technical Problem

A semiconductor power module including switching devices generally has a problem in that a surge voltage is likely to be generated during a switching operation. A magnitude of the surge voltage is proportional to an inductance component of a current path, such as a wiring, etc., through which a current flows, and therefore, one issue is to remove the inductance component from the current path.

With the semiconductor power module disclosed in Patent Document 1, two power supply terminals to which mutually different voltages are applied are arranged across an interval from each other at the one end portion of the resin case.

A distance between the two power supply terminals takes on a comparatively large value because it is set in dependence on a shape of the resin case. A magnetic field generated at one power supply terminal and a magnetic field generated at the other power supply terminal therefore cannot be canceled out satisfactorily, and a mutual inductance component between the terminals is thus likely to increase due to a mutual induction effect.

The present invention thus provides a semiconductor power module with which an inductance component can be reduced.

Solution to Problem

The present invention provides a semiconductor power module including an insulating substrate having one surface and another surface, an output side terminal arranged at a one surface side of the insulating substrate, a first power supply terminal arranged at the one surface side of the insulating substrate, a second power supply terminal to which a voltage of a magnitude different from a voltage applied to the first power supply terminal is to be applied, and arranged at an other surface side of the insulating substrate so as to face the first power supply terminal across the insulating substrate, a first switching device arranged at the one surface side of the insulating substrate and electrically connected to the output side terminal and the first power supply terminal, and a second switching device arranged at the one surface side of the insulating substrate and electrically connected to the output side terminal and the second power supply terminal.

With the present semiconductor power module, a distance between the first power supply terminal and the second power supply terminal can be set based on a thickness of the insulating substrate on which the first power supply terminal and the second power supply terminal are facingly arranged. The first power supply terminal and the second power supply terminal can thereby be arranged in proximity while maintaining an insulating property.

A magnetic field generated at the first power supply terminal and a magnetic field generated at the second power supply terminal can thus be canceled out satisfactorily and therefore a mutual inductance component between the first power supply terminal and the second power supply terminal can be reduced. A semiconductor power module with which an inductance component can be reduced can thus be provided.

The aforementioned or yet other objects, features, and effects of the present invention will be clarified by the following description of preferred embodiments with reference to the accompanying drawings.

DESCRIPTION OF EMBODIMENTS

Figure 1:
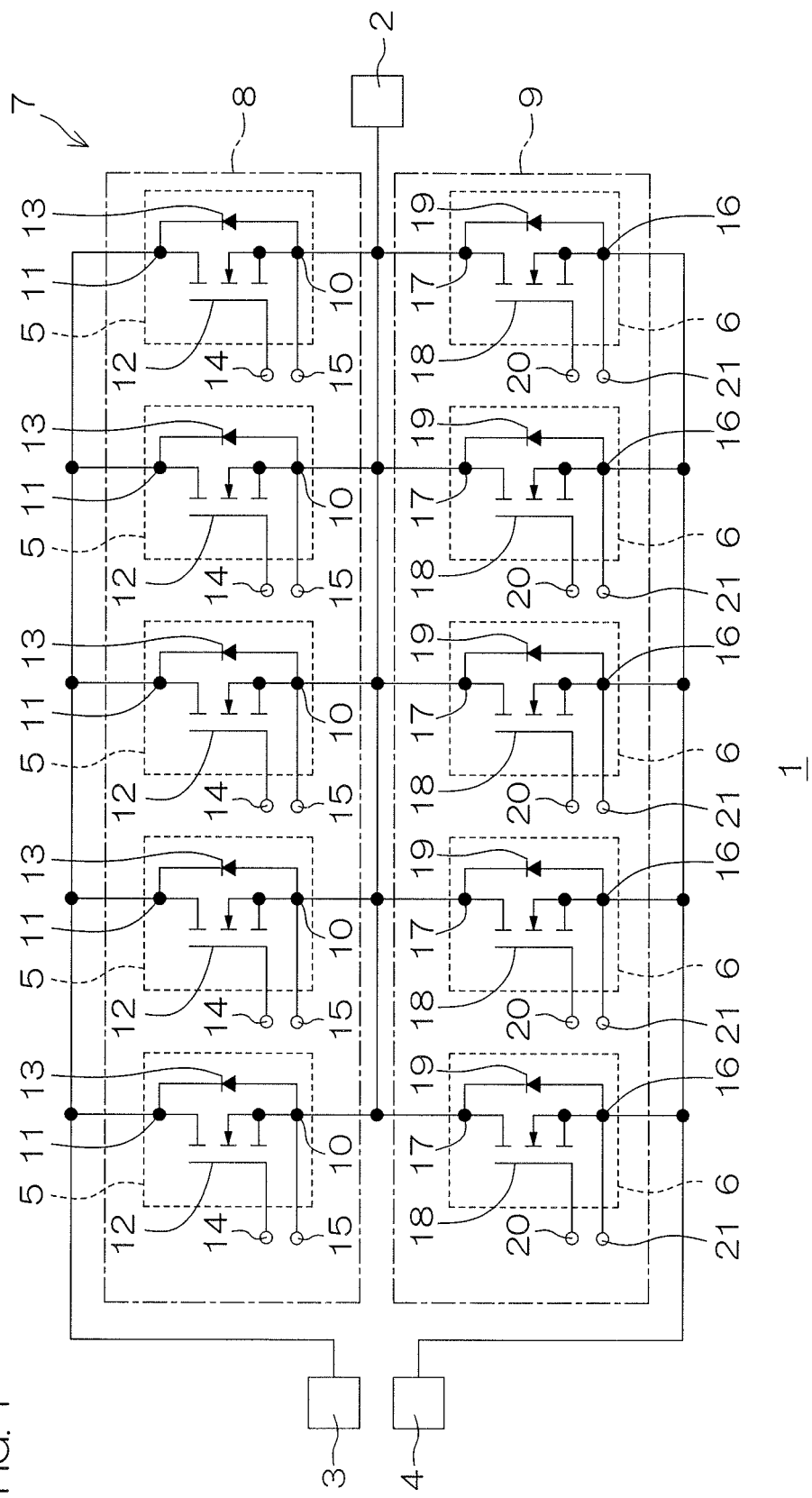
FIG. 1 is an electric circuit diagram of the electric structure of a semiconductor power module according to a preferred embodiment of the present invention.

FIG. 1 is an electric circuit diagram of the electric structure of a semiconductor power module 1 according to a preferred embodiment of the present invention.

Referring to FIG. 1, the semiconductor power module 1 according to the preferred embodiment includes an output side terminal 2, a high voltage side terminal 3 (first power supply terminal), and a low voltage side terminal 4 (second power supply terminal) to which a voltage lower than a voltage applied to the high voltage side terminal 3 is applied.

The semiconductor power module 1 includes a plurality (five in the present preferred embodiment) of first switching devices 5 connected between the output side terminal 2 and the high voltage side terminal 3, and a plurality (five in the present preferred embodiment) of second switching devices 6 connected between the output side terminal 2 and the low voltage side terminal 4.

A half-bridge circuit 7 is constituted of the output side terminal 2, the high voltage side terminal 3, the low voltage side terminal 4, the plurality of first switching devices 5, and the plurality of second switching devices 6. The high voltage side terminal 3 and the low voltage side terminal 4 are arranged in proximity to each other.

The plurality of first switching devices 5 constitute a high voltage side upper arm 8 and the plurality of second switching devices 6 constitute a low voltage side lower arm 9, in the half-bridge circuit 7.

Each first switching device 5 includes a MISFET (Metal Insulator Semiconductor Field Effect Transistor) formed in an Si substrate, an SiC substrate, or a wide bandgap type semiconductor substrate, and has a first source electrode 10, a first drain electrode 11, and a first gate electrode 12, in the present preferred embodiment.

The first source electrode 10 and the first drain electrode 11 constitute a pair of first main electrodes, and the first gate electrode 12 constitutes a first control electrode by which a current flowing between the pair of first main electrodes is controlled, in each first switching device 5. Each first switching device 5 includes a first diode 13 that is reverse bias connected between the first drain electrode 11 and the first source electrode 10.

Each first switching device 5 is connected between the high voltage side terminal 3 and the low voltage side terminal 4 by the first source electrode 10 being electrically connected to the output side terminal 2 and the first drain electrode 11 being electrically connected to the high voltage side terminal 3. The first gate electrode 12 of each first switching device 5 is electrically connected in common to a first gate terminal 14 (first control terminal) on a high voltage side.

The first gate terminal 14 is a terminal by which the respective first switching devices 5 (respective first gate electrodes 12) is driven and controlled. The first source electrodes 10 of each first switching device 5 is electrically connected in common to a first source sense terminal 15 on a high voltage side in addition to the output side terminal 2. The first source sense terminal 15 is a potential detection terminal for detecting a potential of the first source electrodes 10.

Each second switching device 6 includes a MISFET, formed in an Si substrate, an SiC substrate, or a wide bandgap type semiconductor substrate, and has a second source electrode 16, a second drain electrode 17, and a second gate electrode 18, in the present preferred embodiment.

The second source electrode 16 and the second drain electrode 17 constitute a pair of second main electrodes, and the second gate electrode 18 constitutes a second control electrode by which a current flowing between the pair of second main electrodes is controlled in each second switching device 6. Each second switching device 6 includes a second diode 19 that is reverse bias connected between the second drain electrode 17 and the second source electrode 16.

Each second switching device 6 is connected between the output side terminal 2 and the low voltage side terminal 4 by the second drain electrode 17 being electrically connected to the output side terminal 2 and the second source electrode 16 being electrically connected to the low voltage side terminal 4.

The output side terminal 2 is a common terminal to which the first source electrodes 10 of the first switching devices 5 and the second drain electrodes 17 of the second switching devices 6 are connected in common. The second gate electrode 18 of each second switching device 6 is electrically connected in common to a second gate terminal 20 (first control terminal) on a low voltage side.

The second gate terminal 20 is a terminal by which the respective second switching devices 6 (respective second gate electrodes 18) is driven and controlled. The second source electrode 16 of each second switching device 6 is electrically connected in common to a second source sense terminal 21 on a low voltage side in addition to the low voltage side terminal 4. The second source sense terminal 21 is a potential detection terminal for detecting a potential of the second source electrodes 16.

The semiconductor power module 1 according to the present preferred embodiment is arranged, for example, as an inverter module arranged to drive anyone phase among a U phase, a V phase, and a W phase in a three-phase motor having the U phase, the V phase, and the W phase. An inverter device arranged to drive a three-phase motor can thus be provided by including three semiconductor power modules 1 corresponding to the U phase, the V phase, and the W phase.

With the inverter device, a DC power supply is connected between the high voltage side terminals 3 and the low voltage side terminals 4 of the respective semiconductor power modules 1 and the three-phase motor is connected as a load to the output side terminals 2 of the respective semiconductor power modules. A DC voltage, for example, of not less than 500V and not more than 2000V is applied between the high voltage side terminals 3 and the low voltage side terminals 4, with the low voltage side terminal 4 side as a reference potential.

With the inverter device, the first switching devices 5 and the second switching devices 6 of each semiconductor power module 1 are driven and controlled with a predetermined switching pattern. The DC voltage is thereby converted to a three-phase AC voltage and supplied to the three-phase motor. The three-phase motor is thereby sine-wave driven.

An external appearance of the semiconductor power module 1 shall now be described with reference to FIG. 2 and FIG. 3.

Figure 2:
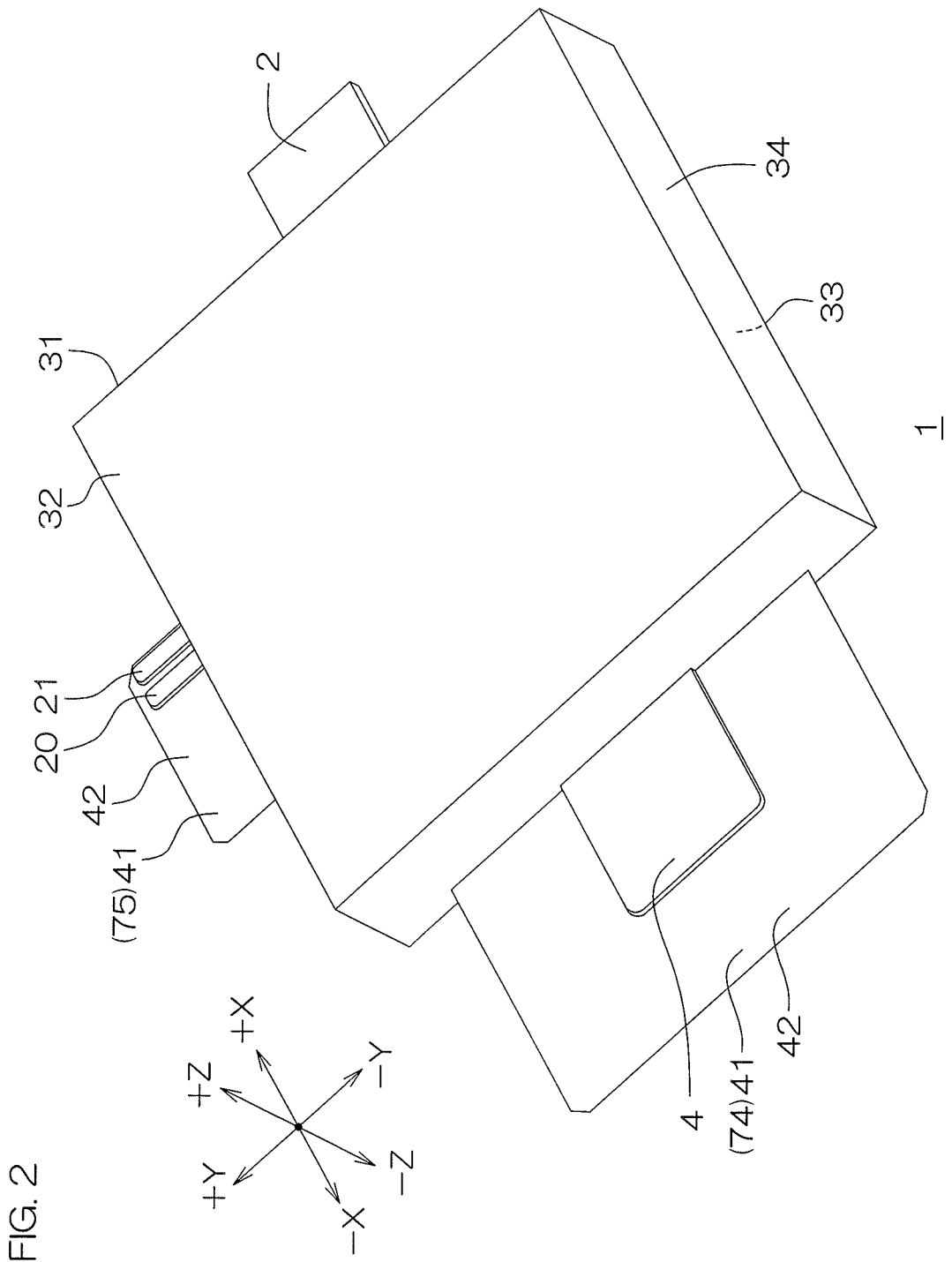
FIG. 2 is a perspective view of the semiconductor power module of FIG. 1 as viewed from an upper side.

FIG. 2 is a perspective view of the semiconductor power module 1 of FIG. 1 as viewed from an upper side. FIG. 3 is a perspective view of the semiconductor power module 1 of FIG. 2 as viewed from a lower side.

The semiconductor power module 1 includes a package body portion 31 formed in a rectangular parallelepiped shape. The package body portion 31 has an upper surface 32 of quadrilateral shape in plan view, a lower surface 33 of the same shape as the upper surface 32, and four side surfaces 34 connecting the upper surface 32 and the lower surface 33.

In the following, a +X direction and a −X direction, a +Y direction and a −Y direction, and a +Z direction and a −Z direction shown in FIG. 2 and FIG. 3 may be used for convenience of description.

The +X direction and the −X direction are two directions oriented along one side of the package body portion 31 and these shall be referred to simply as the "X direction" when referred to collectively. The +Y direction and the −Y direction are two directions oriented along another side of the package body portion 31 orthogonal to the abovementioned one side and these shall be referred to simply as the "Y direction" when referred to collectively. The +Z direction and the −Z direction are two directions oriented along a thickness direction of the package body portion 31 and these shall be referred to simply as the "Z direction" when referred to collectively.

When the package body portion 31 is placed on a horizontal surface, the X direction and the Y direction become two horizontal directions oriented along two mutually orthogonal horizontal rectilinear lines (an X axis and a Y axis), and the Z direction becomes a vertical direction oriented along a vertical rectilinear line (a Z axis).

The package body portion 31 is made of a resin material (a thermosetting resin material) such as an epoxy resin, etc., for example, and seals the switching devices 5, the second switching devices 6, etc.

The output side terminal 2 aforementioned is exposed from the side surface 34 on a +X direction side along the +X direction at the side surface 34 in the package body portion 31. The output side terminal 2 is led out in a quadrilateral shape in plan view from an inner side to an outer side of the package body portion 31, in the present preferred embodiment.

The high voltage side terminal 3 and the low voltage side terminal 4 aforementioned are exposed from the side surface 34 on a −X direction side which is a direction at an opposite side to the direction of exposure of the output side terminal 2 along the −X direction. That is, the output side terminal 2 and the high voltage side terminal 3 plus the low voltage side terminal 4 are arranged at positions facing each other across the package body portion 31.

The high voltage side terminal 3 and the low voltage side terminal 4 are respectively bonded to a portion of an insulating substrate 41 to be described below (a first extension portion 74 of the insulating substrate 41). The high voltage side terminal 3 and the low voltage side terminal 4 are led out in quadrilateral shapes in plan view from the inner side to the outer side of the package body portion 31 together with the portion of the insulating substrate 41.

The low voltage side terminal 4 is bonded to a surface on a +Z direction side of the insulating substrate 41 (hereinafter referred to simply as "front surface 42 of the insulating substrate 41") as shown in FIG. 2. The high voltage side terminal 3 is bonded to a surface on a −Z direction side of the insulating substrate 41 (hereinafter referred to simply as "rear surface 43 of the insulating substrate 41") as shown in FIG. 3.

The first gate terminal 14 and the first source sense terminal 15 aforementioned as well as the second gate terminal 20 and the second source sense terminal 21 aforementioned are exposed from the side surface 34 on a +Y direction side along the +Y direction, which is a different direction from the direction of exposure of the output side terminal 2 (the +X direction) and the direction of exposure of the high voltage side terminal 3 and the low voltage side terminal 4 (the −X direction), in the package body portion 31.

The first gate terminal 14, the first source sense terminal 15, the second gate terminal 20, and the second source sense terminal 21 are respectively bonded to a portion of the insulating substrate 41 to be described below (a second extension portion 75 of the insulating substrate 41).

The first gate terminal 14, the first source sense terminal 15, the second gate terminal 20, and the second source sense terminal 21 are led out in a band shape in plan view (in rectangular shapes in plan view) from the inner side to the outer side of the package body portion 31 together with the portion of the insulating substrate 41 (the second extension portion 75 of the insulating substrate 41).

The second gate terminal 20 and the second source sense terminal 21 are bonded to the front surface 42 of the insulating substrate 41 as shown in FIG. 2. The first gate terminal 14 and the first source sense terminal 15 are bonded to the rear surface 43 of the insulating substrate 41 as shown in FIG. 3.

Figure 3:
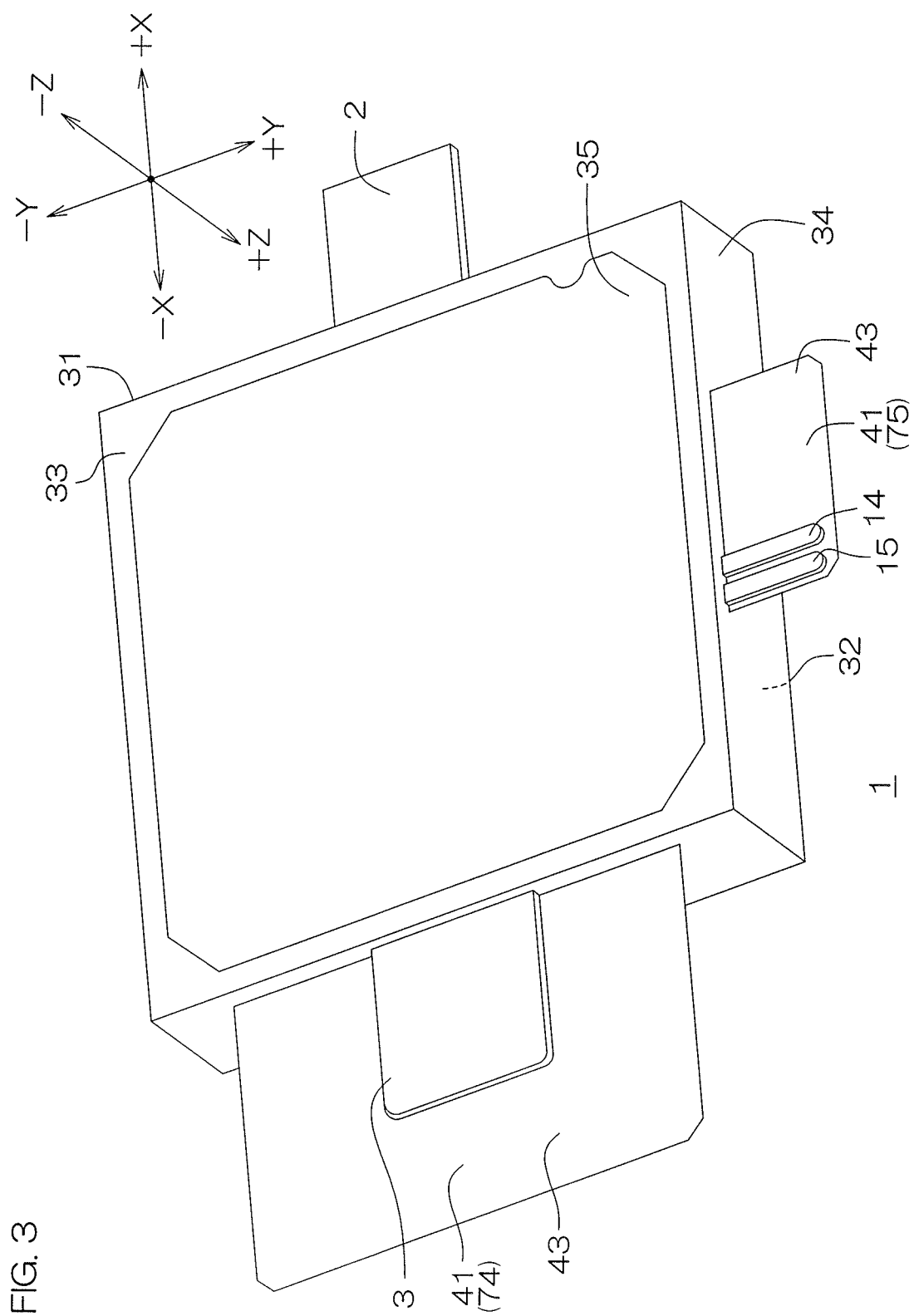
FIG. 3 is a perspective view of the semiconductor power module of FIG. 2 as viewed from a lower side.

Referring to FIG. 3, a heat dissipation member 35 is exposed at the lower surface 33 of the package body portion 31. Heat generated by the first switching devices 5 and the second switching devices 6 is dissipated to an exterior by the heat dissipation member 35.

The internal structure of the semiconductor power module 1 shall now be described specifically with reference to FIG. 4 to FIG. 8.

Figure 4:
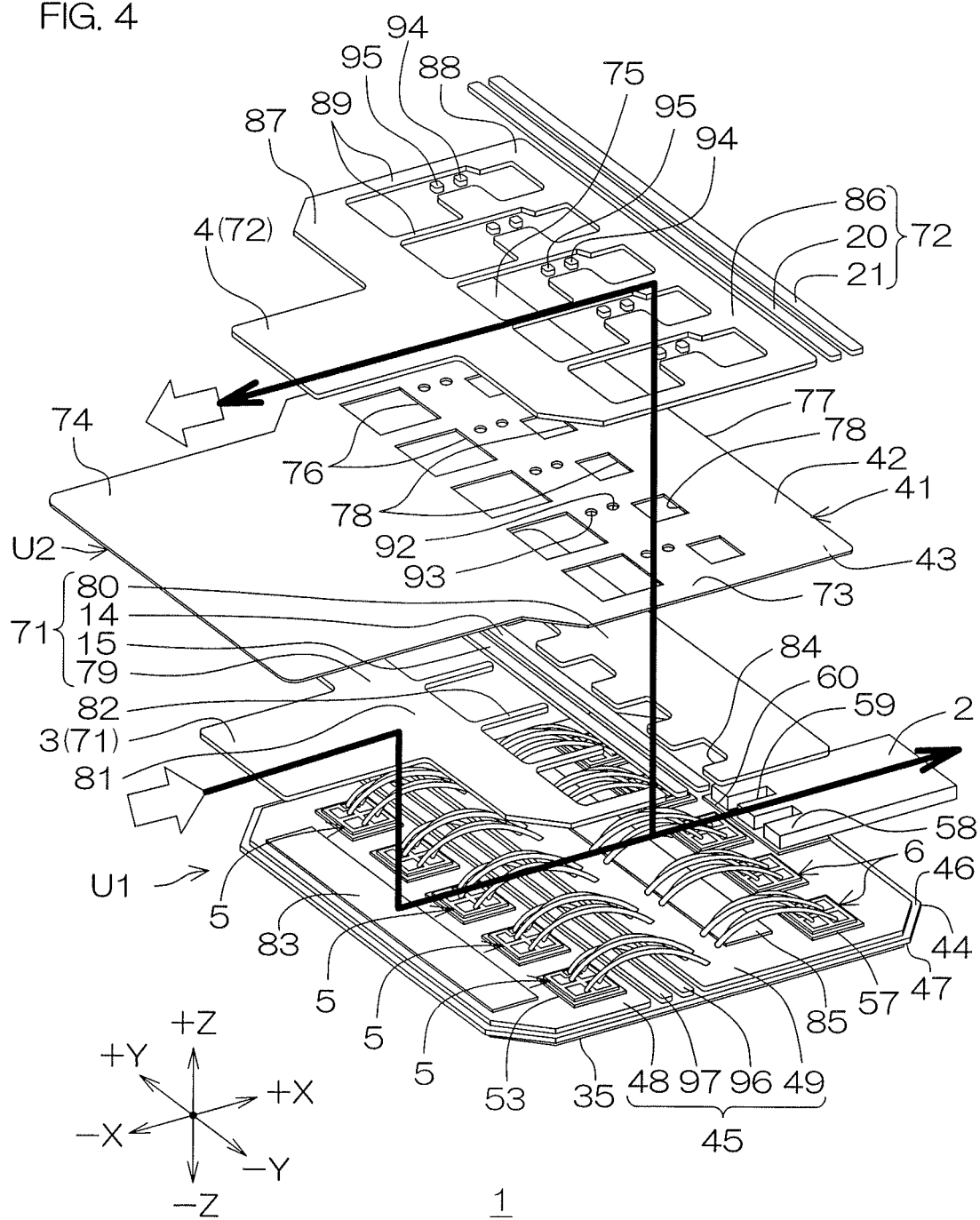
FIG. 4 is an exploded perspective view of the internal structure of the semiconductor power module of FIG. 1.
Figure 5:
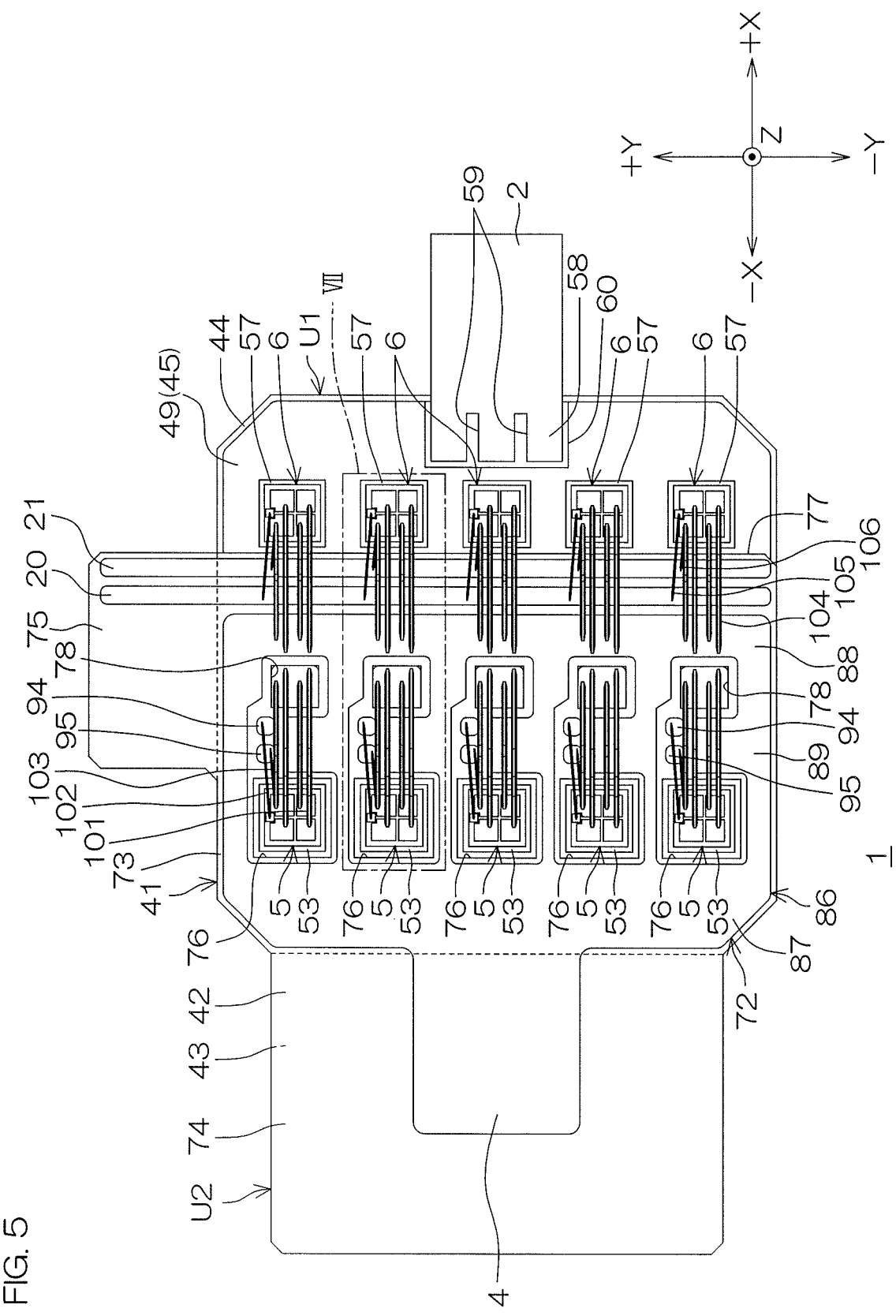
FIG. 5 is a plan view of the internal structure of the semiconductor power module of FIG. 1.
Figure 6:
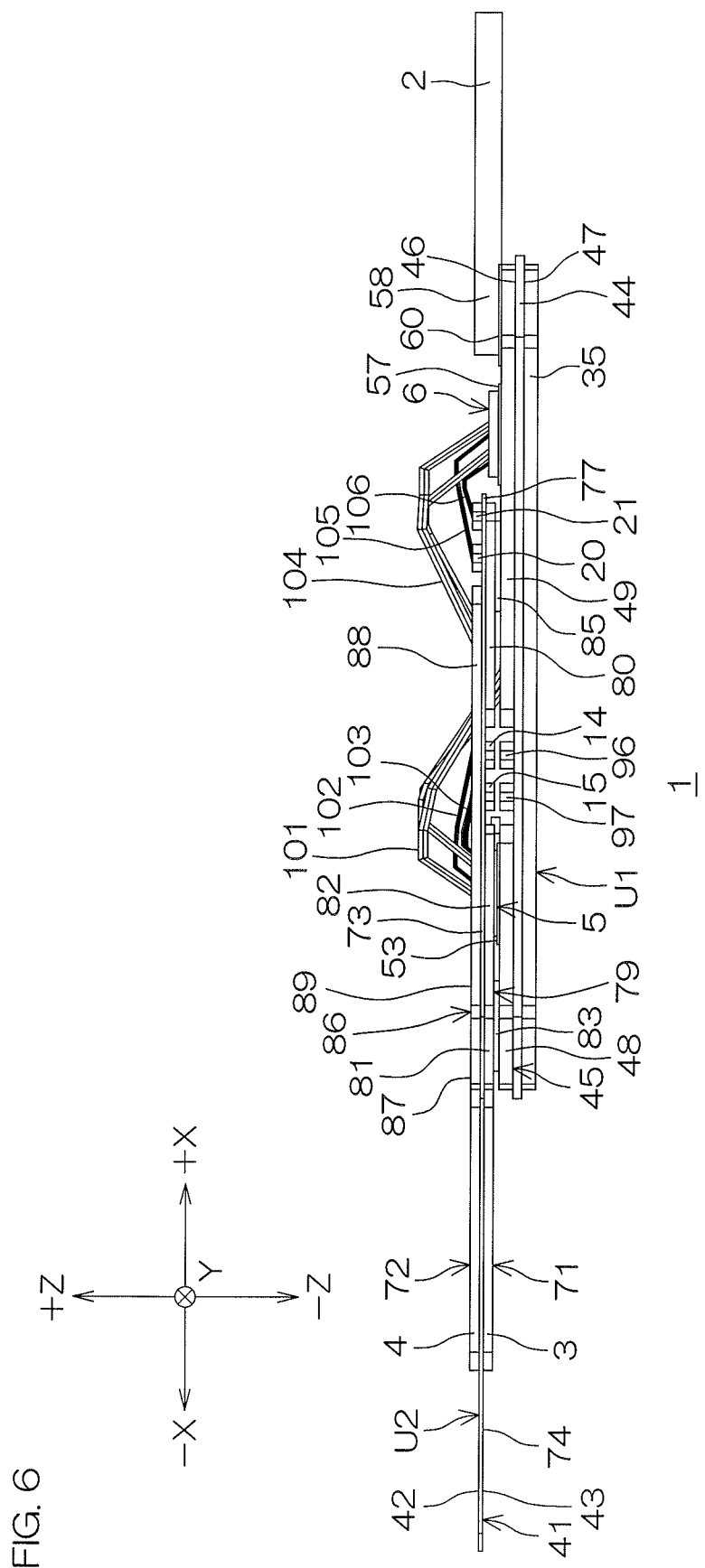
FIG. 6 is a side view of the internal structure of the semiconductor power module of FIG. 1.
Figure 7:
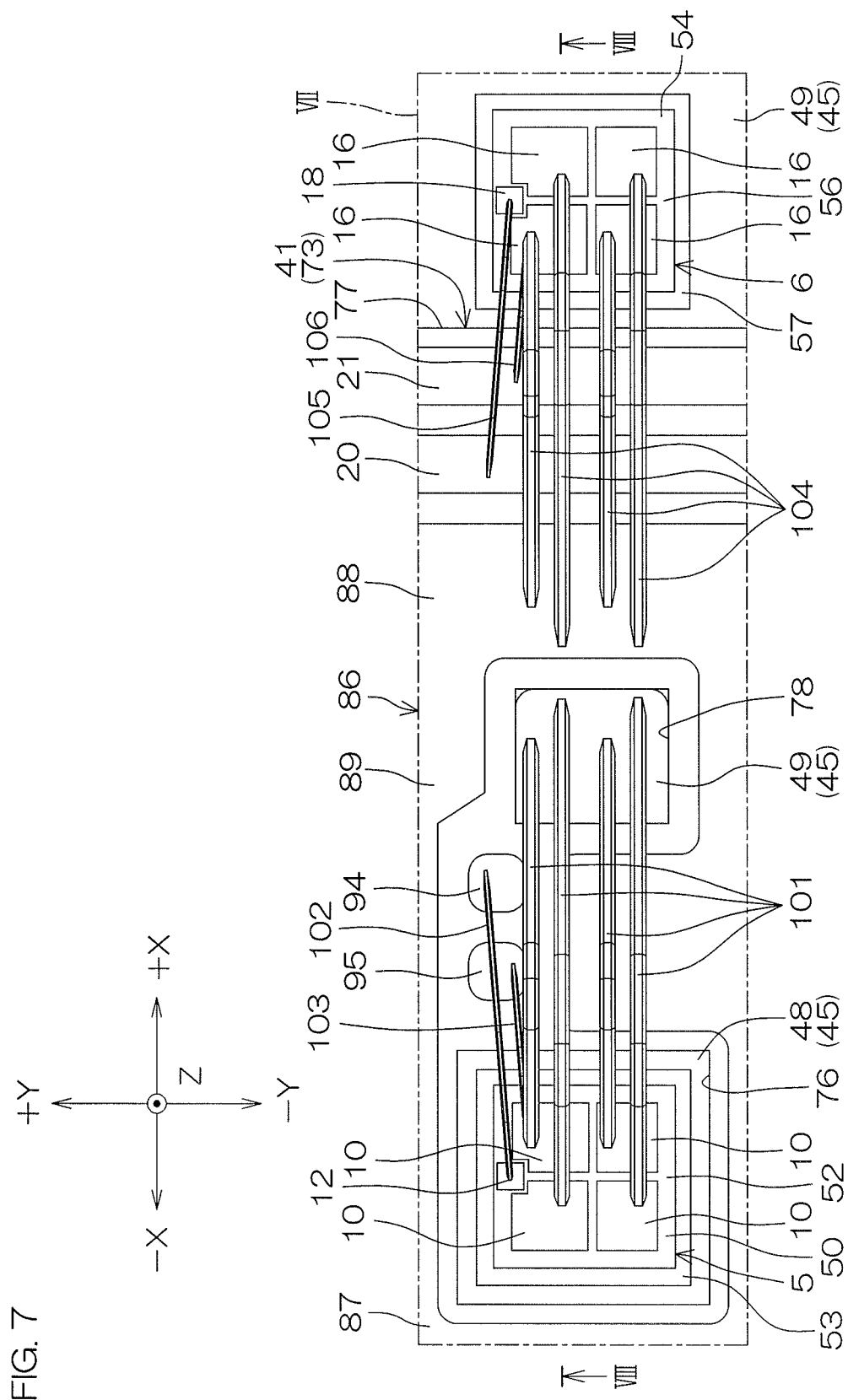
FIG. 7 is an enlarged view of a region VII of FIG. 6.
Figure 8:
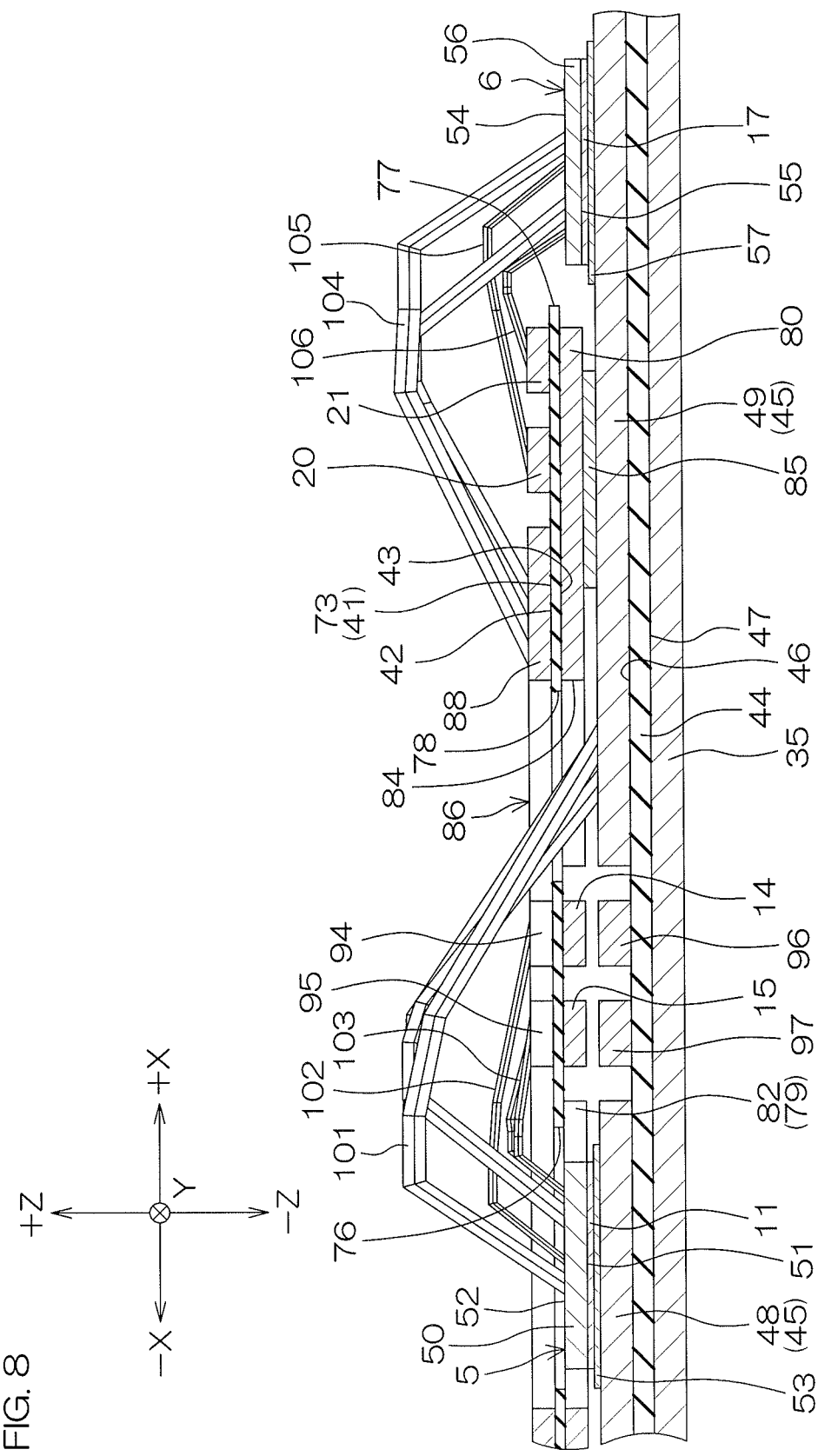
FIG. 8 is a sectional view taken along line VIII-VIII of FIG. 7.

FIG. 4 is an exploded perspective view of the internal structure of the semiconductor power module 1 of FIG. 1. FIG. 5 is a plan view of the internal structure of the semiconductor power module 1 of FIG. 1. FIG. 6 is a side view of the internal structure of the semiconductor power module 1 of FIG. 1. FIG. 7 is an enlarged view of a region VII of FIG. 6. FIG. 8 is a sectional view taken along line VIII-VIII of FIG. 7.

Referring to FIG. 4 to FIG. 6, the semiconductor power module 1 includes the insulating substrate 41. The insulating substrate 41 has the front surface 42 and the rear surface 43. The low voltage side terminal 4 is arranged at the front surface 42 side of the insulating substrate 41. The output side terminal 2 is arranged at the rear surface 43 side of the insulating substrate 41.

The high voltage side terminal 3 is arranged at the rear surface 43 side of the insulating substrate 41. The first switching devices 5 electrically connected to the output side terminal 2 and the high voltage side terminal 3, and the second switching devices 6 electrically connected to the output side terminal 2 and the low voltage side terminal 4 are arranged at the rear surface 43 side of the insulating substrate 41.

The semiconductor power module 1 has a structure where the high voltage side terminal 3 and the low voltage side terminal 4 face each other across the insulating substrate 41. The high voltage side terminal 3 and the low voltage side terminal 4 and the structure peripheral thereof shall now be described.

Referring to FIG. 4, the semiconductor power module 1 according to the present preferred embodiment includes a first unit U1 including the first switching devices 5, the second switching devices 6 and the output side terminal 2, and a second unit U2 including the insulating substrate 41, the high voltage side terminal 3 and the low voltage side terminal 4, the semiconductor power module 1 having a structure where the second unit U2 is stacked on the first unit U1.

Referring to FIG. 4 to FIG. 6, the first unit U1 includes a supporting substrate 44 formed in a quadrilateral shape in plan view, a first conductor pattern 45 formed on the supporting substrate 44, the first switching devices 5 arranged on the first conductor pattern 45, the second switching devices 6 arranged on the first conductor pattern 45, and the output side terminal 2 arranged on the first conductor pattern 45.

The supporting substrate 44 includes a surface on a +Z direction side (hereinafter referred to simply as "front surface 46 of the supporting substrate 44") and a surface on a −Z direction side (hereinafter referred to simply as "rear surface 47 of the supporting substrate 44"). The supporting substrate 44 is arranged across an interval from the insulating substrate 41 to the rear surface 43 side of the insulating substrate 41 and supports the first switching devices 5 and the second switching devices 6 at the front surface 46 side.

The supporting substrate 44 has a thickness of, for example, not more than 5 mm. The supporting substrate 44 may have the thickness of not less than 0.3 mm and not more than 0.7 mm. The supporting substrate 44 may be an inorganic based insulating substrate including a ceramic (for example, AlN, SiN, or $SiO_2$), etc., or an organic based insulating substrate including a resin (for example, epoxy resin), etc.

The first conductor pattern 45 is a conductor film made of Cu (copper), for example, and is directly bonded to the front surface 46 of the supporting substrate 44. The first conductor pattern 45 includes a first high voltage side conductor pattern 48 electrically connecting the high voltage side terminal 3 and the first switching devices 5, and a first output side conductor pattern 49 electrically connecting the output side terminal 2 and the second switching devices 6.

The first high voltage side conductor pattern 48 is arranged at an end portion on the −X direction side of the supporting substrate 44 and is formed in a quadrilateral shape extending along the Y direction in plan view. On the other hand, the first output side conductor pattern 49 is arranged at an end portion on the +X direction side of the supporting substrate 44 and is formed in a quadrilateral shape extending along the Y direction in plan view. An X direction width of the first output side conductor pattern 49 is set to a larger value than an X direction width of the first high voltage side conductor pattern 48.

Referring to FIG. 4 and FIG. 5, the first switching devices 5 are bonded onto the first high voltage side conductor pattern 48. The first switching devices 5 are arranged so as to be aligned in a single column along the Y direction.

Referring to FIG. 7 and FIG. 8, each first switching device 5 is a so-called vertical MISFET including a first device body portion 52 having a first device front surface 50 on the +Z direction side at which the first source electrode 10 and the first gate electrode 12 are arranged, and a first device rear surface 51 on the −Z direction side at which the first drain electrode 11 is arranged. The first device body portion 52 includes an Si substrate, an SiC substrate, or a wide bandgap type semiconductor substrate.

Four first source electrodes 10 and one first gate electrode 12 are formed on the first device front surface 50 in the present preferred embodiment. Each first switching device 5 is bonded to the first high voltage side conductor pattern 48 in a state where the first device rear surface 51 of the first device body portion 52 faces the front surface 46 of the supporting substrate 44.

Each first switching device 5 is bonded to the first high voltage side conductor pattern 48 by the first drain electrode 11 and the first high voltage side conductor pattern 48 being bonded via a first conductive bonding material 53. The first conductive bonding material 53 may be a solder.

Referring to FIG. 4 and FIG. 5, the second switching devices 6 are bonded onto the first output side conductor pattern 49. The second switching devices 6 are arranged so as to be aligned in a single column along the Y direction and face the respective first switching devices 5 in one-to-one correspondence in the X direction.

Referring to FIG. 7 and FIG. 8, each second switching device 6 is a so-called vertical MISFET including a second device body portion 56 having a second device front surface 54 on the +Z direction side at which the second source electrode 16 and the second gate electrode 18 are arranged, and a second device rear surface 55 on the −Z direction side at which the second drain electrode 17 is arranged. The second device body portion 56 includes an Si substrate, an SiC substrate, or a wide bandgap type semiconductor substrate.

Four second source electrodes 16 and one second gate electrode 18 are formed on the second device front surface 54, in the present preferred embodiment. Each second switching device 6 is bonded to the first output side conductor pattern 49 in a state where the second device rear surface 55 of the second device body portion 56 faces the front surface 46 of the supporting substrate 44.

Each second switching device 6 is bonded to the first output side conductor pattern 49 by the second drain electrode 17 and the first output side conductor pattern 49 being bonded via a second conductive bonding material 57. The second conductive bonding material 57 may be a solder.

Referring to FIG. 4 and FIG. 5, the output side terminal 2 is arranged at the +X direction end portion side of the supporting substrate 44 across intervals from the respective second switching devices 6 and is bonded to a central portion of a length direction of the first output side conductor pattern 49.

The output side terminal 2 has a thickness greater than a thickness of the high voltage side terminal 3 or a thickness of the low voltage side terminal 4. The output side terminal 2 is electrically connected in common to the first switching devices 5 and the second switching devices 6 as mentioned above.

The output side terminal 2 therefore preferably has a thickness at least not less than a total value of the thickness of the high voltage side terminal 3 and the thickness of the low voltage side terminal 4 from a standpoint of suppressing increase of resistance value.

The output side terminal 2 is formed in a plate shape or a block shape of a quadrilateral shape in plan view that extends in the X direction and has a plurality of notched portions 59 at an end portion 58 on the −X direction side, in the present preferred embodiment. The plurality of notched portions 59 is respectively formed in a groove shape extending along the same direction (X direction), in the present preferred embodiment.

The end portion 58 of the output side terminal 2 is bonded to the first output side conductor pattern 49 via a third conductive bonding material 60. The third conductive bonding material 60 may be a solder. In a state where the end portion 58 of the output side terminal 2 and the first output side conductor pattern 49 are bonded by the third conductive bonding material 60, the third conductive bonding material 60 enters inside the notched portions 59 formed at the end portion 58.

The first unit U1 further includes the heat dissipation member 35 arranged at the rear surface 47 side of the supporting substrate 44. The heat dissipation member 35 covers substantially an entire area of the rear surface 47 of the supporting substrate 44 except for an edge portion, and is formed by a conductor film of a quadrilateral shape in plan view that is made of copper (Cu) and that is directly bonded to the rear surface 47 of the supporting substrate 44, in the present preferred embodiment.

The heat generated by the first switching devices 5 and the second switching devices 6 is transmitted to the heat dissipation member 35 via the first conductor pattern 45 and the supporting substrate 44 and dissipated to the exterior.

Referring to FIG. 4 to FIG. 6, the second unit U2 includes the insulating substrate 41, a second conductor pattern 71 arranged at the rear surface 43 side of the insulating substrate 41, and a third conductor pattern 72 arranged at the front surface 42 side of the insulating substrate 41.

The insulating substrate 41 has a thickness of, for example, not more than 5 mm. The insulating substrate 41 may have the thickness of not less than 0.3 mm and not more than 0.7 mm. The insulating substrate 41 may be an inorganic based insulating substrate including a ceramic (for example, AlN, SiN, or $SiO_2$), etc., or may be an organic based insulating substrate including a resin (for example, epoxy resin), etc.

The insulating substrate 41 includes a body portion 73 of quadrilateral shape in plan view that faces the front surface 46 of the supporting substrate 44 in plan view, a first extension portion 74 extended along the −X direction from an end portion on the −X direction side of the body portion 73 to a region outside the supporting substrate 44, and a second extension portion 75 extended along the +Y direction from an end portion on the +Y direction side of the body portion 73 to the region outside the supporting substrate 44. The insulating substrate 41 is formed in an L shape in plan view by the body portion 73, the first extension portion 74, and the second extension portion 75.

The body portion 73 of the insulating substrate 41 is arranged so as to face the first high voltage side conductor pattern 48 and the first output side conductor pattern 49.

The body portion 73 of the insulating substrate 41 includes a plurality (five in the present preferred embodiment) of first removed regions 76 respectively exposing the first device front surfaces 50 of the first switching devices 5 in plan view, a second removed region 77 exposing the second switching devices 6, and a plurality (five in the present preferred embodiment) of third removed regions 78 selectively exposing an end portion on the −X direction side of the first output side conductor pattern 49.

The first removed regions 76, the second removed region 77, and the third removed regions 78 are regions formed by portions of the insulating substrate 41 being removed selectively and respectively expose members arranged at a region on the −Z direction side of the insulating substrate 41. The first removed regions 76, the second removed region 77, and the third removed regions 78 respectively include openings and/or notched portions.

The respective first removed regions 76 are openings of quadrilateral shapes in plan view that respectively expose one of the first switching devices 5 in one-to-one correspondence, and are formed so as to be aligned at equal intervals in a single column along the Y direction, in the present preferred embodiment.

The respective first removed regions 76 may be notched portions of quadrilateral shapes in plan view that respectively expose one of the first switching devices 5 in one-to-one correspondence, instead of openings. A plurality or one of a first removed region 76 being an opening and/or a notched portion of a quadrilateral shape in plan view extending in the Y direction so as to expose two or more first switching devices 5 or all switching devices 5 together may be formed, instead of the first removed regions 76.

The second removed region 77 is formed by a peripheral edge on the +X direction side of the insulating substrate 41 and exposes an end portion on the +X direction side of the first output side conductor pattern 49 in addition to the second switching devices 6, in the present preferred embodiment.

A plurality of second removed regions 77 being openings and/or notched portions of quadrilateral shapes in plan view that respectively expose one of the second switching devices 6 in one-to-one correspondence and are aligned in a single column along the Y direction may be formed, instead of the second removed region 77 formed by the peripheral edge on the +X direction side of the insulating substrate 41.

Obviously, a plurality or one of a second removed region 77 being an opening and/or a notched portion of quadrilateral shape in plan view extending in the Y direction so as to expose two or more second switching devices 6 or all second switching devices 6 together may be formed.

The plurality of third removed regions 78 are formed so as to be aligned in a single column along the Y direction and face the plurality of first removed regions 76 in one-to-one correspondence in the X direction. A plurality or one of a third removed region 78 being an opening and/or a notched portion of quadrilateral shape in plan view extending in the Y direction so as to face two or more first switching devices 5 or all first switching devices 5 together in the X direction may be formed.

The first extension portion 74 of the insulating substrate 41 is a portion that frees from facing the supporting substrate 44 in plan view and is formed in a quadrilateral shape in plan view, in the present preferred embodiment. A Y direction width of the first extension portion 74 of the insulating substrate 41 is set to a value smaller than a Y direction width of the body portion 73.

The second extension portion 75 of the insulating substrate 41 is a portion that frees from facing the supporting substrate 44 in plan view and is formed in a quadrilateral shape in plan view, in the present preferred embodiment. An X direction width of the second extension portion 75 of the insulating substrate 41 is set to a value smaller than an X direction width of the body portion 73.

Referring to FIG. 4, the second conductor pattern 71 arranged at the rear surface 43 side of the insulating substrate 41 is a conductor film made of copper (Cu), for example, and is directly bonded to the rear surface 43 of the insulating substrate 41.

The second conductor pattern 71 integrally includes the high voltage side terminal 3 bonded to the first extension portion 74 of the insulating substrate 41, a second high voltage side conductor pattern 79 bonded to the body portion 73 of the insulating substrate 41 and electrically connected to the high voltage side terminal 3 and the first high voltage side conductor pattern 48 (first switching devices 5), and a second output side conductor pattern 80 electrically connected to the first output side conductor pattern 49.

The high voltage side terminal 3 is arranged at a position across inward interval from a peripheral edge of the first extension portion 74 at the first extension portion 74 of the insulating substrate 41 and is formed in a quadrilateral shape in plan view.

The peripheral edge of the high voltage side terminal 3 is arranged at position separated by at least not less than 2 mm from the peripheral edge of the first extension portion 74 of the insulating substrate 41, and an insulating region is thereby set between the peripheral edge of the high voltage side terminal 3 and the peripheral edge of the first extension portion 74 of the insulating substrate 41.

The second high voltage side conductor pattern 79 includes a first high voltage side portion 81 bonded to the end portion on the −X direction side of the body portion 73 and connected to the high voltage side terminal 3. The first high voltage side portion 81 is electrically connected to the first high voltage side conductor pattern 48 via a fourth conductive bonding material 83.

The second high voltage side conductor pattern 79 includes a second high voltage side portion 82 of a comb-teeth shape led out from the first high voltage side portion 81 toward sides of the respective first switching devices 5 (first removed regions 76).

The second output side conductor pattern 80 is arranged at an end portion on the +X direction side of the insulating substrate 41 and is formed in a quadrilateral shape in plan view that extends in the Y direction. The second output side conductor pattern 80 is electrically connected to the first output side conductor pattern 49 via a fifth conductive bonding material 85 in a region between the end portion on the −X direction side of the first output side conductor pattern 49 and the second switching devices 6.

The second output side conductor pattern 80 has a plurality (five in the present preferred embodiment) of fourth removed regions 84 selectively exposing the first output side conductor pattern 49 at positions corresponding to each of the plurality of third removed regions 78 of the insulating substrate 41.

An end portion on the −X direction side of the second output side conductor pattern 80 is formed in a comb-teeth shape by the plurality of fourth removed regions 84. The fourth removed regions 84 may be openings and/or notched portions of quadrilateral shapes in plan view that extend in the Y direction.

The end portion on the −X direction side of the first output side conductor pattern 49 is selectively exposed by the third removed regions 78 of the insulating substrate 41 and the fourth removed region 84 of the second output side conductor pattern 80.

The third conductor pattern 72 arranged at the front surface 42 side of the insulating substrate 41 is a conductor film made of Cu (copper), for example, and is directly bonded to the front surface 42 of the insulating substrate 41.

The third conductor pattern 72 integrally includes the low voltage side terminal 4 bonded to the second extension portion 75 of the insulating substrate 41, and a low voltage side conductor pattern 86 bonded to the body portion 73 of the insulating substrate 41 and electrically connected to the low voltage side terminal 4.

The low voltage side terminal 4 is arranged at a position across inward interval from a peripheral edge of the first extension portion 74 at the first extension portion 74 of the insulating substrate 41 and is formed in a quadrilateral shape in plan view. The low voltage side terminal 4 faces the high voltage side terminal 3 across the first extension portion 74 of the insulating substrate 41.

The low voltage side terminal 4 is formed in the quadrilateral shape in plan view that is the same in area and same in shape as the high voltage side terminal 3 and an entirety thereof faces the high voltage side terminal 3 across the first extension portion 74 of the insulating substrate 41, in the present preferred embodiment.

The peripheral edge of the low voltage side terminal 4 is arranged at position separated by at least not less than 2 mm from the peripheral edge of the first extension portion 74 of the insulating substrate 41, and an insulating region is thereby set between the peripheral edge of the low voltage side terminal 4 and the peripheral edge of the first extension portion 74 of the insulating substrate 41.

The low voltage side conductor pattern 86 includes a first low voltage side portion 87 bonded to the end portion on the −X direction side of the body portion 73 and connected to the low voltage side terminal 4, a second low voltage side portion 88 bonded to the end portion on the +X direction side of the body portion 73, and a third low voltage side portion 89, connecting the above portions.

The third low voltage side portion 89 connects the first low voltage side portion 87 and the second low voltage side portion 88 so as to avoid the first removed regions 76 and the third removed regions 78.

The low voltage side conductor pattern 86 faces the second high voltage side conductor pattern 79 across the body portion 73 of the insulating substrate 41. More specifically, the first low voltage side portion 87 of the low voltage side conductor pattern 86 faces the first high voltage side portion 81 of the second high voltage side conductor pattern 79 across the body portion 73 of the insulating substrate 41. The third low voltage side portion 89 of the low voltage side conductor pattern 86 faces the second high voltage side portion 82 of the second high voltage side conductor pattern 79 across the body portion 73 of the insulating substrate 41.

Referring to FIG. 4 and FIG. 5, the second conductor pattern 71 arranged at the rear surface 43 side of the insulating substrate 41 further includes the high voltage side first gate terminal 14 and the high voltage side first source sense terminal 15 aforementioned.

The first gate terminal 14 and the first source sense terminal 15 are arranged adjacent to each other between the second high voltage side conductor pattern 79 and the second output side conductor pattern 80. The first gate terminal 14 is arranged at the −X direction side and the first source sense terminal 15 is arranged at the +X direction side, in the present preferred embodiment.

The first gate terminal 14 and the first source sense terminal 15 are respectively formed in band shapes in plan view (in rectangular shapes in plan view) that extend along the Y direction and are led out from the body portion 73 of the insulating substrate 41 to the second extension portion 75.

Portions of the first gate terminal 14 and the first source sense terminal 15 that are led out to the second extension portion 75 of the insulating substrate 41 are respectively arranged at positions across inward interval from a peripheral edge of the second extension portion 75.

A plurality (five in the present preferred embodiment) of first contact holes 92 selectively exposing the first gate terminal 14 and a plurality (five in the present preferred embodiment) of second contact holes 93 selectively exposing the first source sense terminal 15 are formed selectively in the body portion 73 of the insulating substrate 41.

Each of the first contact holes 92 is provided in each region between the first removed region 76 and the third removed region 78. Each of second contact holes 93 is provided in each region between the first removed regions 76 and the third removed regions 78 so as to be mutually adjacent to the first contact holes 92.

The third conductor pattern 72 arranged at the front surface 42 side of the insulating substrate 41 includes a plurality (five in the present preferred embodiment) of gate pads 94 connected to the first gate terminal 14 via the respective first contact holes 92 and a plurality (five in the present preferred embodiment) of source sense pads 95 connected to the first source sense terminal 15 via the respective second contact holes 93.

The third conductor pattern 72 includes the low voltage side second gate terminal 20 and the low voltage side second source sense terminal 21 aforementioned. The second gate terminal 20 and the second source sense terminal 21 are respectively arranged at the end portion on the +X direction side of the insulating substrate 41 (in a region between the peripheral edge on the +X direction side of the insulating substrate 41 and the second low voltage side portion 88 of the low voltage side conductor pattern 86). The second gate terminal 20 is arranged at the −X direction side, and the second source sense terminal 21 is arranged at the +X direction side, in the present preferred embodiment.

The second gate terminal 20 and the second source sense terminal 21 are respectively formed in band shapes in plan view (in rectangular shapes in plan view) that extend along the Y direction and are led out from the body portion 73 of the insulating substrate 41 to the second extension portion 75.

Portions of the second gate terminal 20 and the second source sense terminal 21 that are led out to the second extension portion 75 of the insulating substrate 41 are respectively arranged at positions across inward interval from the peripheral edge of the second extension portion 75.

The second gate terminal 20 and the second source sense terminal 21 are bonded to positions that free from overlapping with the first gate terminal 14 and the first source sense terminal 15 in plan view, in the present preferred embodiment (see also FIG. 2 and FIG. 3).

The first conductor pattern 45 arranged at the front surface 46 side of the supporting substrate 44 includes a dummy gate terminal 96 provided in correspondence to the first gate terminal 14, and a dummy source sense terminal 97 provided in correspondence to the first source sense terminal 15.

The dummy gate terminal 96 and the dummy source sense terminal 97 are arranged between the first high voltage side conductor pattern 48 and the first output side conductor pattern 49, and entireties thereof are positioned on the front surface 46 of the supporting substrate 44.

Referring to FIG. 5, FIG. 7, and FIG. 8, the first source electrodes 10 of the respective first switching devices 5 are electrically connected to the first output side conductor pattern 49 bonded to the front surface 46 of the supporting substrate 44 via first bonding wires 101 as connecting members.

The first bonding wires 101 are arranged at the front surface 42 side of the insulating substrate 41 and connect the first source electrodes 10 of the respective first switching devices 5 and the first output side conductor pattern 49 via the first removed regions 76 and the third removed regions 78 (fourth removed regions 84 of the second output side conductor pattern 80) of the insulating substrate 41.

The first source electrodes 10 are therefore electrically connected to the output side terminal 2 via the first bonding wires 101 and the first output side conductor pattern 49, in each first switching device 5.

The first drain electrode 11 is electrically connected to the high voltage side terminal 3 via the first high voltage side conductor pattern 48 and the second high voltage side conductor pattern 79, in each first switching device 5. Each first switching device 5 is thereby electrically connected between the output side terminal 2 and the high voltage side terminal 3.

The first gate electrode 12 of the respective first switching devices 5 is electrically connected to the gate pad 94 via second bonding wire 102 as a connecting member. The first gate electrode 12 of the respective first switching devices 5 and the first gate terminal 14 are thereby electrically connected.

At least one of the first source electrodes 10 of each first switching device 5 is electrically connected to a source sense pad 95 via a third bonding wire 103 as a connecting member. At least one of the first source electrodes 10 of each first switching device 5 and the first source sense terminal 15 are thereby electrically connected.

On the other hand, the second source electrodes 16 of the respective second switching devices 6 are electrically connected to the low voltage side conductor pattern 86 (second low voltage side portion 88 of the low voltage side conductor pattern 86) bonded to the front surface 42 of the insulating substrate 41 via fourth bonding wires 104 as connecting members.

The fourth bonding wires 104 are arranged at the front surface 42 side of the insulating substrate 41 and connect the second source electrodes 16 of the respective second switching devices 6 and the low voltage side conductor pattern 86 via the second removed region 77 of the insulating substrate 41.

The second source electrodes 16 are therefore electrically connected to the low voltage side terminal 4 via the fourth bonding wires 104 and the low voltage side conductor pattern 86, in each second switching device 6.

The second drain electrode 17 is electrically connected to the output side terminal 2 via the first output side conductor pattern 49, in each second switching device 6. Each second switching device 6 is thereby electrically connected between the output side terminal 2 and the low voltage side terminal 4.

The second gate electrode 18 of the respective second switching devices 6 is electrically connected to the second gate terminal 20 via fifth bonding wire 105 as a connecting member. The fifth bonding wire 105 is arranged at the front surface 42 side of the insulating substrate 41 and connects the second gate electrode 18 of the respective second switching devices 6 and the second gate terminal 20 via the second removed region 77 of the insulating substrate 41.

At least one of the second source electrodes 16 of each second switching device 6 is electrically connected to the second source sense terminal 21 via a sixth bonding wire 106 as a connecting member.

The sixth bonding wires 106 are arranged at the front surface 42 side of the insulating substrate 41 and connect at least one of the second source electrodes 16 of the respective second switching devices 6 and the second source sense terminal 21 via the second removed region 77 of the insulating substrate 41.

The package body portion 31 seals the insulating substrate 41 and the supporting substrate 44 so as to selectively expose a portion of the output side terminal 2, a portion of the high voltage side terminal 3, a portion of the low voltage side terminal 4, a portion of the first gate terminal 14, a portion of the first source sense terminal 15, a portion of the second gate terminal 20, a portion of the second source sense terminal 21, and the heat dissipation member 35.

The portion of the high voltage side terminal 3 and the portion of the low voltage side terminal 4 are led out to the outer side of the package body portion 31 together with the first extension portion 74 of the insulating substrate 41. The portion of the first gate terminal 14, the portion of the first source sense terminal 15, the portion of the second gate terminal 20, and the portion of the second source sense terminal 21 are led out to the outer side of the package body portion 31 together with the second extension portion 75 of the insulating substrate 41.

The package body portion 31 may be formed by a transfer molding method or may be formed by a compression molding method.

The package body portion 31 selectively sealing the insulating substrate 41, etc., is formed by pouring a resin into a metal mold having a cavity of predetermined shape in which the insulating substrate 41, etc. are housed, in the transfer molding method. The insulating substrate 41, etc., specifically refers to the internal structure of the semiconductor power module 1 with the exception of the package body portion 31 (the same applies hereinafter).

The package body portion 31 selectively sealing the insulating substrate 41, etc., is formed by infusing an interior of a metal mold having a cavity of predetermined shape with a resin and thereafter immersing the insulating substrate 41, etc. in the resin, or housing and disposing the insulating substrate 41, etc. in an interior of a metal mold having a cavity of predetermined shape and thereafter infusing the interior of the metal mold with a resin, in the compression molding method The package body portion 31 may have an arrangement including a housing made of resin (a resin case) having an internal space, and the insulating substrate 41, etc., housed inside the internal space of the housing As described above, according to the semiconductor power module 1, the single half-bridge circuit 7 is formed by the output side terminal 2, the high voltage side terminal 3, the low voltage side terminal 4, the first switching devices 5 connected to the output side terminal 2 and the high voltage side terminal 3, and the second switching devices 6 connected to the output side terminal 2 and the low voltage side terminal 4.

The first switching devices 5 constitute the high voltage side upper arm 8, and the second switching devices 6 constitute the low voltage side lower arm 9 in the half-bridge circuit 7.

According to the semiconductor power module 1, a current path leading from the high voltage side terminal 3 toward the output side terminal 2 via the respective first switching devices 5 is formed at the rear surface 43 side of the insulating substrate 41 and a current path leading from the output side terminal 2 toward the low voltage side terminal 4 via the respective second switching devices 6 is formed at the front surface 42 side of the insulating substrate 41.

A direction of the current flowing through the high voltage side terminal 3 and a direction of the current flowing through the low voltage side terminal 4 are therefore made opposite across the insulating substrate 41.

Moreover, a distance between the high voltage side terminal 3 and the low voltage side terminal 4 can be set based on the thickness (of not more than 5 mm in the present preferred embodiment) of the insulating substrate 41, on which the high voltage side terminal 3 and the low voltage side terminal 4 are facingly arranged, and therefore the high voltage side terminal 3 and the low voltage side terminal 4 can be arranged in proximity satisfactorily while maintaining an insulating property.

A magnetic field generated at the high voltage side terminal 3 and a magnetic field generated at the low voltage side terminal 4 can thus be canceled out satisfactorily and therefore a mutual inductance component between the high voltage side terminal 3 and the low voltage side terminal 4 can be reduced satisfactorily. The semiconductor power module with which an inductance component can be reduced satisfactorily can thus be provided.

According to the semiconductor power module 1 of the present preferred embodiment, the insulating substrate 41 selectively includes the first removed regions 76 exposing the first switching devices 5 in plan view and the second removed region 77 exposing the second switching devices 6.

The heat generated by the first switching devices 5 can thus be dissipated from the rear surface 43 side to the front surface 42 side of the insulating substrate 41 via the first removed regions 76, and the heat generated by the second switching devices 6 can be dissipated from the rear surface 43 side to the front surface 42 side of the insulating substrate 41 via the second removed region 77.

Temperature rises of the first switching devices 5 and the second switching devices 6 can thereby be suppressed satisfactorily. According to an arrangement where the supporting substrate 44 is arranged at the −Z direction side of the insulating substrate 41 especially as in the semiconductor power module 1 of the present preferred embodiment, accumulation of heat between the insulating substrate 41 and the supporting substrate 44 can be suppressed effectively by providing the insulating substrate 41 with the first removed regions 76 and the second removed region 77.

In addition, according to the semiconductor power module 1 of the present preferred embodiment, the heat dissipation 35 is arranged at the rear surface 47 side of the supporting substrate 44. The heat generated by the first switching devices 5 and the heat generated by the second switching devices 6 can thus be dissipated satisfactorily to the exterior via the supporting substrate 44 and the heat dissipation member 35. The semiconductor power module 1 that can effectively suppress the temperature rises of the first switching devices 5 and the second switching devices 6 can thus be provided.

Although a preferred embodiment of the present invention has been described above, the present invention may also be implemented in yet other modes.

For example, with the preferred embodiment described above, an example where the single half-bridge circuit 7 is constituted of the first switching devices 5 and the second switching devices 6 was described. However, the number of the first switching devices 5 and the number of the second switching devices 6 are not restricted thereto.

The single half-bridge circuit 7 therefore may be constituted of one first switching device 5 and one second switching device 6. The single half-bridge circuit 7 may be constituted of two or more first switching devices 5 and two or more second switching devices 6.

Although an example where MISFETs are adopted as the first switching devices 5 and the second switching devices 6 was described with the preferred embodiment described above, the arrangements shown in FIG. 9 or FIG. 10 may be adopted instead.

Figure 9:
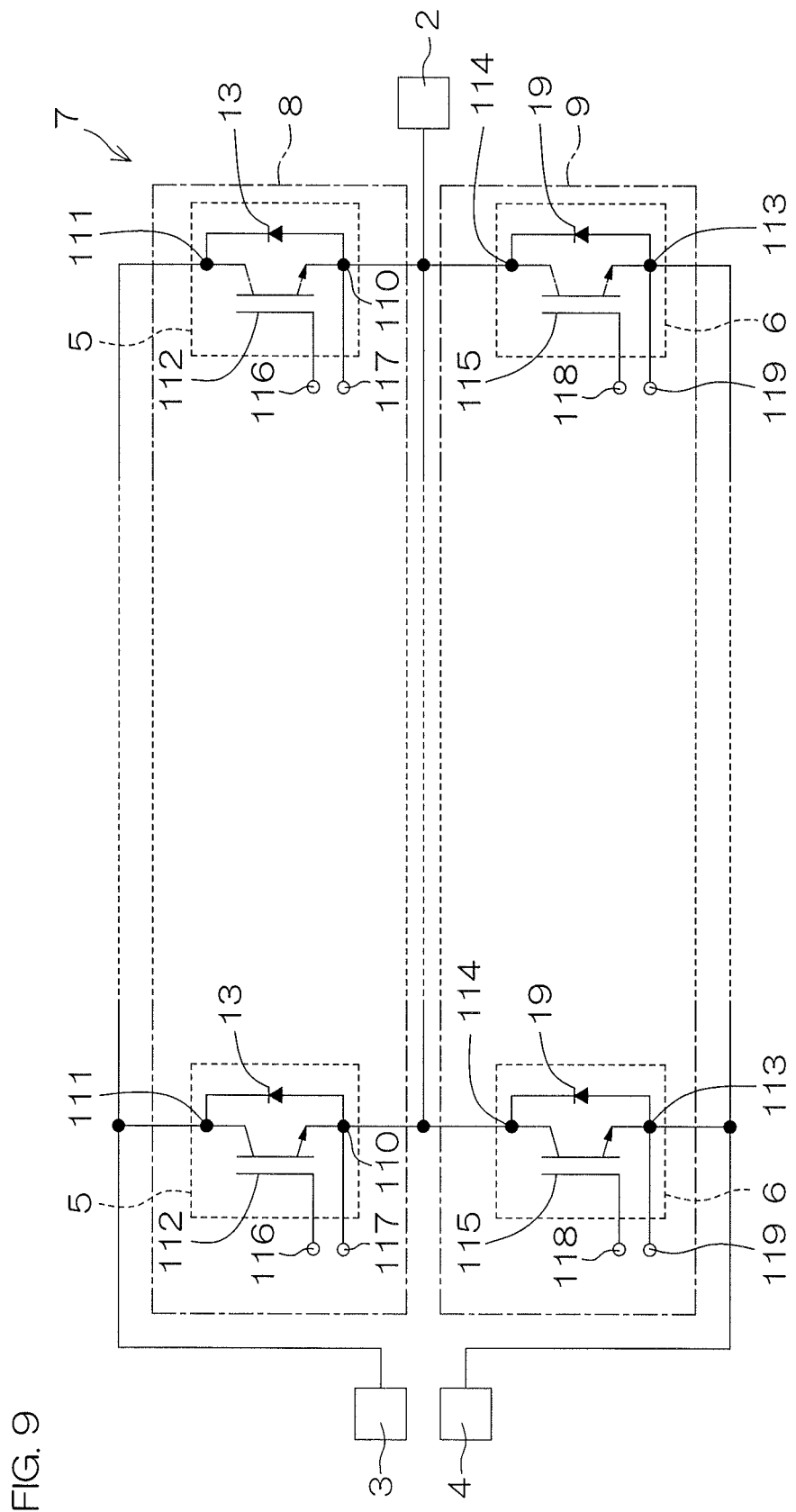
FIG. 9 is an electric circuit diagram of an electric structure according to a first modification example of the semiconductor power module of FIG. 1.

In the following, the arrangement of FIG. 9 shall be described and thereafter the arrangement of FIG. 10 shall be described. FIG. 9 is an electric circuit diagram of an electric structure according to a first modification example of the semiconductor power module 1 of FIG. 1. In FIG. 9, arrangements shown in FIG. 1, etc. described above shall be provided with the same reference symbols and description thereof shall be omitted.

With the mode shown in FIG. 9, IGBTs (Insulated Gate Bipolar Transistors) are adopted in place of MISFETs as the first switching devices 5 and the second switching devices 6.

That is, the half-bridge circuit 7 is constituted of IGBTs. Each of the first switching devices 5 and the second switching devices 6 may include an IGBT formed in an Si substrate, an SiC substrate, or a wide bandgap type semiconductor substrate.

In this case, each first switching device 5 includes a first emitter electrode 110 in place of the first source electrode 10, a first collector electrode 111 in place of the first drain electrode 11, and a first gate electrode 112 in place of the first gate electrode 12.

In each first switching device 5, the first emitter electrode 110 and the first collector electrode 111 constitute a pair of first main electrodes, and the first gate electrode 112 constitutes a first control electrode, controlling a current flowing between the pair of first main electrodes.

Each second switching device 6 includes a second emitter electrode 113 in place of the second source electrode 16, a second collector electrode 114 in place of the second drain electrode 17, and a second gate electrode 115 in place of the second gate electrode 18.

In each second switching device 6, the second emitter electrode 113 and the second collector electrode 114 constitute a pair of first main electrodes, and the second gate electrode 115 constitutes a first control electrode, controlling a current flowing between the pair of first main electrodes.

In the mode shown in FIG. 9, the first gate electrodes 112 are electrically connected to a first gate terminal 116 in place of the first gate terminal 14, and the first emitter electrodes 110 are electrically connected to a first emitter sense terminal 117 in place of the first source sense terminal 15.

The second gate electrodes 115 are electrically connected to a second gate terminal 118 in place of the second gate terminal 20, and the second emitter electrodes 113 are electrically connected to a second emitter sense terminal 119 in place of the second source sense terminal 21. Even with such an arrangement, the same effects as the effects described above with the preferred embodiment can be exhibited.

Figure 10:
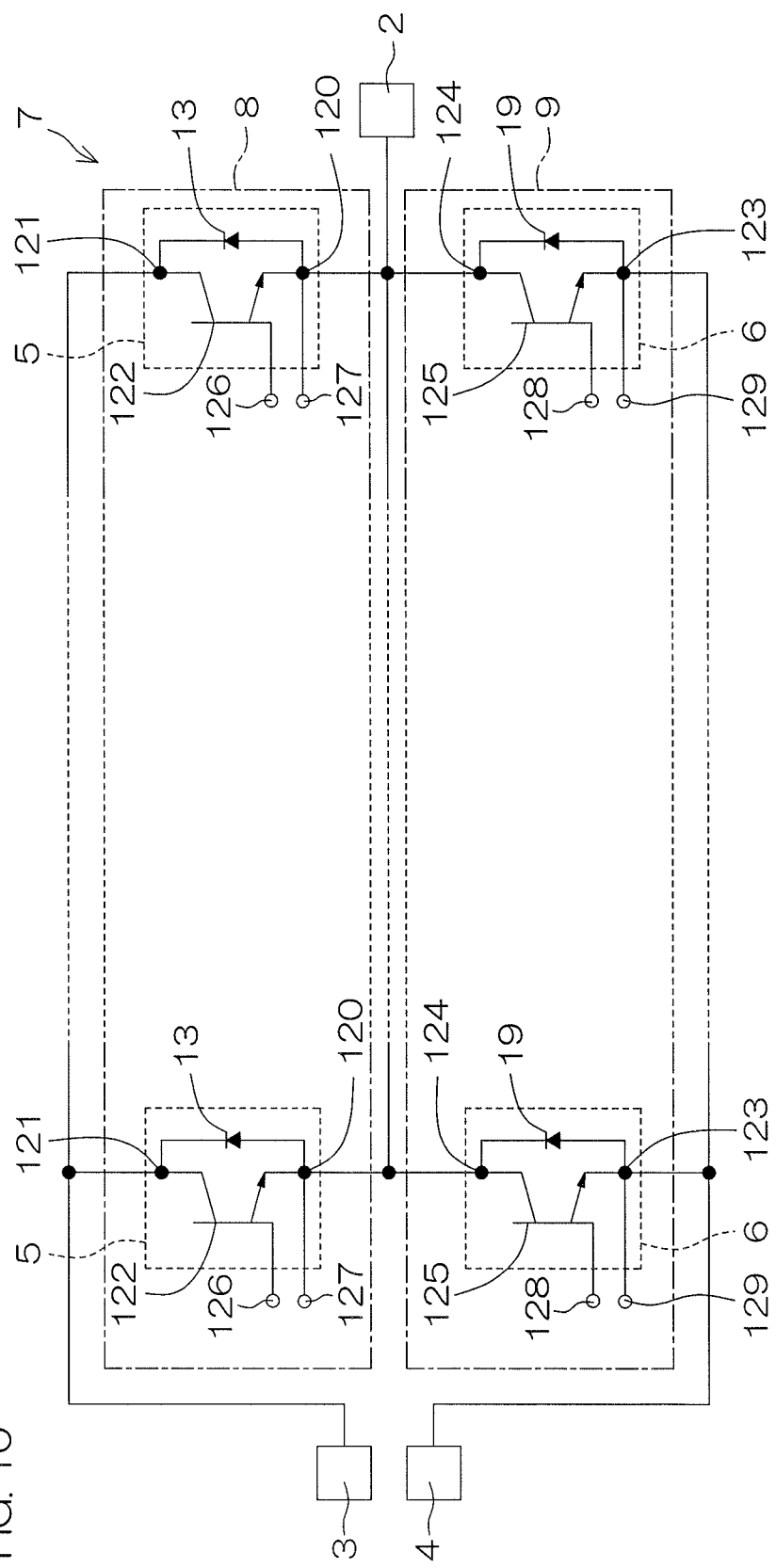
FIG. 10 is an electric circuit diagram of an electric structure according to a second modification example of the semiconductor power module of FIG. 1.

FIG. 10 is an electric circuit diagram of an electric structure according to a second modification example of the semiconductor power module 1 of FIG. 1. In FIG. 10, arrangements shown in FIG. 1, etc. described above shall be provided with the same reference symbols and description thereof shall be omitted.

With the mode shown in FIG. 10, BJTs (Bipolar Junction Transistors) are adopted in place of MISFETs as the first switching devices 5 and the second switching devices 6.

That is, the half-bridge circuit 7 is constituted of BJTs. Each of the first switching devices 5 and the second switching devices 6 may include a BJT formed in an Si substrate, an SiC substrate, or a wide bandgap type semiconductor substrate.

In this case, each first switching device 5 includes a first emitter electrode 120 in place of the first source electrode 10, a first collector electrode 121 in place of the first drain electrode 11, and a first base electrode 122 in place of the first gate electrode 12.

In each first switching device 5, the first emitter electrode 120 and the first collector electrode 121 constitute a pair of first main electrodes, and the first base electrode 122 constitutes a first control electrode, controlling a current flowing between the pair of first main electrodes.

Each second switching device 6 includes a second emitter electrode 123 in place of the second source electrode 16, a second collector electrode 124 in place of the second drain electrode 17, and a second base electrode 125 in place of the second gate electrode 18.

In each second switching device 6, the second emitter electrode 123 and the second collector electrode 124 constitute a pair of first main electrodes, and the second base electrode 125 constitutes a first control electrode, controlling a current flowing between the pair of first main electrodes.

In the mode shown in FIG. 10, the first base electrodes 122 are electrically connected to a first base terminal 126 in place of the first gate terminal 14, and the first emitter electrodes 120 are electrically connected to a first emitter sense terminal 127 in place of the first source sense terminal 15.

The second base electrodes 125 are electrically connected to a second base terminal 128 in place of the second gate terminal 20, and the second emitter electrodes 123 are electrically connected to a second emitter sense terminal 129 in place of the second source sense terminal 21. Even with such an arrangement, the same effects as the effects described above with the preferred embodiment can be exhibited.

Each of the MISFET, IGBT, and BJT mentioned above is preferably formed in the SiC substrate or the wide bandgap type semiconductor substrate among the Si substrate, SiC substrate, and wide bandgap type semiconductor substrate mentioned above. A supplementary description of the wide bandgap type semiconductor substrate shall now be provided.

The wide bandgap type semiconductor substrate refers, more specifically, to a substrate formed of a semiconductor material having a bandgap of greater value than a bandgap of silicon (=approximately 1.0 eV to 1.2 eV).

As examples of a semiconductor material of the wide bandgap type semiconductor substrate, group III-V semiconductors, including group III elements and group V elements, nitride semiconductors (for example, gallium nitride, etc.), and diamond, etc. can be cited. The SiC substrate mentioned above is an example of the wide bandgap type semiconductor substrate.

The present application corresponds to Japanese Patent Application No. 2016-110383 filed in the Japan Patent Office on Jun. 1, 2016, and the entire disclosure of this application is incorporated herein by reference.

While preferred embodiments of the present invention have been described in detail above, these are merely specific examples used to clarify the technical contents of the present invention, and the present invention should not be interpreted as being limited only to these specific examples, and the spirit and scope of the present invention shall be limited only by the appended claims.

1 Semiconductor power module
2 Output side terminal
3 High voltage side terminal
4 Low voltage side terminal
5 First switching device
6 Second switching device
7 Half-bridge circuit
31 Package body portion
35 Heat dissipation member
41 Insulating substrate
42 Front surface of insulating substrate
43 Rear surface of insulating substrate
45 Supporting substrate
46 Front surface of supporting substrate
47 Rear surface of supporting substrate
76 First removed region of insulating substrate
77 Second removed region of insulating substrate

The invention claimed is:
1. A semiconductor power module comprising:
an insulating substrate of a thickness of 5 mm or less having one surface and the other surface;
a first power supply terminal arranged at the one surface side of the insulating substrate;
a second power supply terminal arranged at the other surface side of the insulating substrate such as to cancel out at least a part of a magnetic field generated from the first power supply terminal; and
a switching device that is arranged at the one surface side of the insulating substrate, and to which at least a part of a terminal voltage between the first power supply terminal and the second power supply terminal is to be applied, wherein the switching device includes a first switching device and a second switching device that configures a half-bridge circuit with the first switching device, and the semiconductor power module further comprising:
an output terminal that is electrically connected to a node between the first switching device and the second switching device and that has a thickness greater than a thickness of the first terminal or a thickness of the second terminal;
a resin selectively covering the insulating substrate, the first power supply terminal, the second power supply terminal and the output terminal such as to partially expose the insulating substrate, the first power supply terminal, the second power supply terminal and the output terminal;
a first control terminal controlling the first switching device; and
a second control terminal controlling the second switching device;
wherein the resin selectively covers the first control terminal and the second control terminal such as to partially expose the first control terminal and the second control terminal.

2. The semiconductor power module according to claim 1, wherein a direction of a current flowing through the first power supply terminal and a direction of a current flowing through the second power supply terminal are made opposite across the insulating substrate.

3. The semiconductor power module according to claim 1, wherein the first power supply terminal is a high voltage side terminal, and
the second power supply terminal is a low voltage side terminal to which a voltage lower than a voltage applied to the first power supply terminal is to be applied.

4. The semiconductor power module according to claim 1, further comprising:
a removed region formed in the insulating substrate such as to dissipate heat generated from the switching device from the one surface side to the other surface side.

5. The semiconductor power module according to claim 1, further comprising:
a supporting substrate that is arranged at the one surface side of the insulating substrate, that has a facing surface facing the one surface of the insulating substrate and an opposite surface opposite to the facing surface, and that supports the switching device with the facing surface.

6. The semiconductor power module according to claim 5, further comprising:
a heat dissipation member arranged at the opposite surface side.

7. The semiconductor power module according to claim 1, wherein the insulating substrate is made of an inorganic insulating substrate or an organic insulating substrate.

8. The semiconductor power module according to claim 1, wherein the thickness of the output terminal is not less than a total value of the thickness of the first power supply terminal and the thickness of the second power supply terminal.

9. The semiconductor power module according to claim 1, wherein a plurality of the first switching devices are arranged at the one surface side of the insulating substrate such as to be connected each other in parallel, and
a plurality of the second switching devices are arranged at the one surface side of the insulating substrate such as to be connected each other in parallel.

10. The semiconductor power module according to claim 1, wherein the first power supply terminal and the second power supply terminal are arranged at a distance from a peripheral edge of the insulating substrate, respectively.

11. The semiconductor power module according to claim 10, wherein a distance between the first power supply terminal and the peripheral edge of the insulating substrate and a distance between the second power supply terminal and the peripheral edge of the insulating substrate are set to 2 mm or more, respectively.

12. The semiconductor power module according to claim 1, wherein the output terminal is arranged at a position facing the first power supply terminal and the second power supply terminal across the resin as viewed in plan.

13. The semiconductor power module according to claim 1, wherein the first control terminal and the second control terminal are each exposed from the resin in directions different from directions in which the first control terminal, the second control terminal and the output terminal are exposed from the resin.

14. The semiconductor power module according to claim 1, wherein the first switching device includes a pair of first main electrodes and a first control electrode by which a current flowing between the pair of first main electrodes is to be controlled,
the second switching device includes a pair of second main electrodes and a second control electrode by which a current flowing between the pair of second main electrodes is to be controlled,
the first control terminal is electrically connected to the first control electrode of the first switching device, and
the second control terminal is electrically connected to the second control electrode of the second switching device.

15. The semiconductor power module according to claim 1, wherein the switching device includes a MISFET, an IGBT or a BJT.

16. The semiconductor power module according to claim 15, wherein the switching device includes an Si substrate or a wide bandgap semiconductor substrate, and
the MISFET, the IGBT or the BJT is formed in the Si substrate or the wide bandgap semiconductor substrate.

17. The semiconductor power module according to claim 1, wherein the semiconductor power module is configured so that the terminal voltage is 500V or more.

\* \* \* \* \*